United States Patent
Kohara et al.

(10) Patent No.: US 6,749,730 B2
(45) Date of Patent: Jun. 15, 2004

(54) SPUTTER DEVICE

(75) Inventors: Toshimitsu Kohara, Hyogo (JP); Koichiro Akari, Hyogo (JP)

(73) Assignee: Kobe Steel, Ltd., Kobe (JP)

( * ) Notice: Subject to any disclaimer, the term of this patent is extended or adjusted under 35 U.S.C. 154(b) by 0 days.

(21) Appl. No.: 10/344,365

(22) PCT Filed: Mar. 28, 2002

(86) PCT No.: PCT/JP02/03134
§ 371 (c)(1),
(2), (4) Date: Feb. 11, 2003

(87) PCT Pub. No.: WO02/079536
PCT Pub. Date: Oct. 10, 2002

(65) Prior Publication Data
US 2003/0155236 A1 Aug. 21, 2003

(30) Foreign Application Priority Data
Mar. 30, 2001 (JP) ........................................ 2001-100720

(51) Int. Cl.⁷ ............................................... C23C 14/35
(52) U.S. Cl. ............................. 204/298.2; 204/298.26; 204/298.19; 204/298.16; 204/298.18
(58) Field of Search ....................... 204/298.16, 298.17, 204/298.18, 298.19, 298.2, 298.26

(56) References Cited

U.S. PATENT DOCUMENTS 4,880,515 A * 11/1989 Yoshikawa et al. .... 204/192.12
5,196,105 A * 3/1993 Feuerstein et al. ..... 204/298.19
5,512,156 A * 4/1996 Yamanishi et al. .... 204/298.16
6,156,170 A 12/2000 Akari et al. ........... 204/298.18

FOREIGN PATENT DOCUMENTS

| JP | 63-57765 | 3/1988 |
|----|----------|--------|
| JP | 2-194172 | 7/1990 |
| JP | 3-190127 | 8/1991 |
| JP | 2000-309867 | 11/2000 |

* cited by examiner

Primary Examiner—Rodney G. McDonald
(74) Attorney, Agent, or Firm—Oblon, Spivak, McClelland, Maier & Neustadt, P.C.

(57) ABSTRACT

An object of the present invention is to alter the shape of the magnetic field with ease in the state of auxiliary magnet poles being disposed in a sputtering apparatus.

In a sputtering apparatus according to the present invention, one or more magnetron type sputtering evaporation sources 3 and one or more auxiliary magnet poles 9 are disposed in a chamber 1 so as to surround a solid substance 2 to be deposited, wherein an angle changing mechanism for changing the alignment angle of the auxiliary magnet poles 9 relative to the solid substance 2 to be deposited in order to alter the shape of the magnetic field formed by the magnetron type sputtering evaporation sources 3 and the auxiliary magnet poles 9.

6 Claims, 10 Drawing Sheets

7 LINE OF MAGNETIC FORCE

SPUTTER DEVICE

TECHNICAL FIELD

The present invention relates to a sputtering apparatus for forming a thin layer by utilizing the magnetron sputtering method.

BACKGROUND ART

In Japanese Patent Application No. 11-228377, the present applicant has proposed a technology for obtaining plasma having a high density in the surrounding of a substrate to be sputtered by disposing auxiliary magnet poles in the vicinity of magnetron type sputtering evaporation sources in order to confine with a high efficiency the plasma generated from the evaporation sources in the surrounding of a solid substance to be deposited, i.e., a substrate.

In a technology proposed by Japanese Patent Application No. 11-228377, for instance, magnetron type sputtering evaporation sources and auxiliary magnet poles are arranged in such a manner that they surround a solid substance to be deposited, in which case, the polarity of the auxiliary magnet poles is aligned so as to be opposite to the polarity of the outside magnet poles forming the magnetron for an evaporation source, so that the magnetic field is formed such that it surrounds the substrate so as to confine the plasma into the surrounding of the substrate.

In another technology proposed by Japanese Patent Application No. 11-228377, for instance, magnetron type sputtering evaporation sources and auxiliary magnet poles are arranged so as to surround a solid substance to be deposited, in which case the polarity of the auxiliary magnet poles is aligned in the same direction as the polarity of the outer magnet poles forming the magnetron for an evaporation source, so that the magnetic field is concentrated between the adjacent evaporation sources and the auxiliary poles, thereby enabling a plasma generated from the evaporation sources to be confined within the surrounding of the substrate by the mirror effect.

It is a basic object of the present invention to alter with ease the shape of the magnetic field, when the auxiliary magnet poles are mounted in a sputtering apparatus.

In other words, an alteration of the shape of the magnetic field in the vicinity of the substrate makes it possible to adjust the density of the plasma in the vicinity of the substrate and, at the same time, to control the substrate bias current.

In this case, the alteration of the shape of the magnetic field can be realized, for instance, by supplying an electric current to coils disposed on the rear surface of the evaporation sources. However, since the coils are apart to some extent from the discharge space, the effect of alteration is relatively small and besides there appears a possible danger of disturbing the magnetic field above the evaporation sources.

In such a sputtering apparatus as that in Japanese Patent application No. 11-228377, wherein auxiliary magnet poles are disposed, the shape of the magnetic field can be altered by remounting the auxiliary magnet poles to alter the polarity thereof in the direction to the substrate, after the auxiliary magnet poles are dismounted. However, this causes a great deal of work to be put for dismounting/mounting the auxiliary magnet poles, thereby causing a less workability to be provided. Moreover, the dismounting/mounting of the auxiliary magnet poles provides setting only an S or N polarity in the direction towards the substrate and therefore only two types of the shape of the magnetic field are formed in the vicinity of the substrate, so that the shape of the magnetic field cannot be precisely altered.

In the case of altering the shape of the magnetic field by dismounting/mounting of the auxiliary magnet poles, the shape of the magnetic field cannot be altered during the process of deposition.

DISCLOSURE OF THE INVENTION

In the present invention, the auxiliary magnet poles are used to alter the shape of the magnetic field, and for this purpose the following techniques are employed: In accordance with a specific aspect of the invention, a sputtering apparatus wherein one or more magnetron type sputtering evaporation sources and one or more auxiliary magnet poles are arranged so as to enclose a solid substance to be deposited, wherein an angle changing mechanism is provided to change the alignment angle of said one or more auxiliary magnet pole relative to the solid substance to be deposited in order to alter the shape of the magnetic field which is produced by the magnetron type sputtering evaporation sources and the auxiliary magnet poles.

The alteration of the alignment angle of the auxiliary magnet pole relative to the solid substance to be deposited by means of the changing mechanism for the auxiliary magnet poles allows the shape of the magnetic field to be intentionally altered, so that the density of plasma can be altered to a greater extent in the vicinity of the solid substance to be deposited (substrate). Furthermore, the adjustability of the substrate bias current permits the conditions of forming the layer at an optimal bias current to be selected in accordance with the type of the layer and the type of the substrate.

In accordance with the invention, the usage of coils is not required to alter the shape of the magnetic field, thereby enabling the cost of preparing the coils, a power supply for the coils and the like to be saved and, at the same time, allowing the disturbance in the magnetic field in the evaporation source to be excluded. Since, moreover, the system according to the invention provides an easier alteration of the shape of the magnetic field in a greater amount, compared with the coil system, the bias current can be adjusted in a wide range.

In accordance with the invention, it is preferable that the angle changing mechanism is capable of changing the alignment angle of the auxiliary magnet poles at an arbitrary value. In this case, the changeability of the auxiliary magnet poles in an arbitrary angle permits the shape of the magnetic field to be finely altered, so that the bias current can also be finely adjusted.

In accordance with the invention, it is preferable that the shape of the magnetic field can be altered easily even during the deposition process, if the angle changing mechanism can be driven during the deposition process. In particular, it is preferable that if the mechanical power supply used for changing the angle of the auxiliary magnet poles for the angle changing mechanism is disposed outside the chamber, a simple structure can be provided.

In this case, a manual manipulation unit disposed outside the chamber to manually operate the angle changing mechanism outside the chamber can be employed as a mechanical power supply. Alternately, a driving apparatus (for example, a motor or a pneumatic device) for automatically changing the alignment angle of the auxiliary magnet poles by supplying a mechanical power to the direction changing mechanism from the outside can also be used as a mechanical power supply.

Moreover, when a plurality of auxiliary magnet poles is disposed, it is preferable that the alignment angle can be simultaneously changed for these auxiliary magnet poles. Such synchronization in the alignment of the auxiliary magnet poles allows the shape of the magnetic field to be totally altered.

BEST MODE FOR CARRYING OUT THE INVENTION

Figure 1:
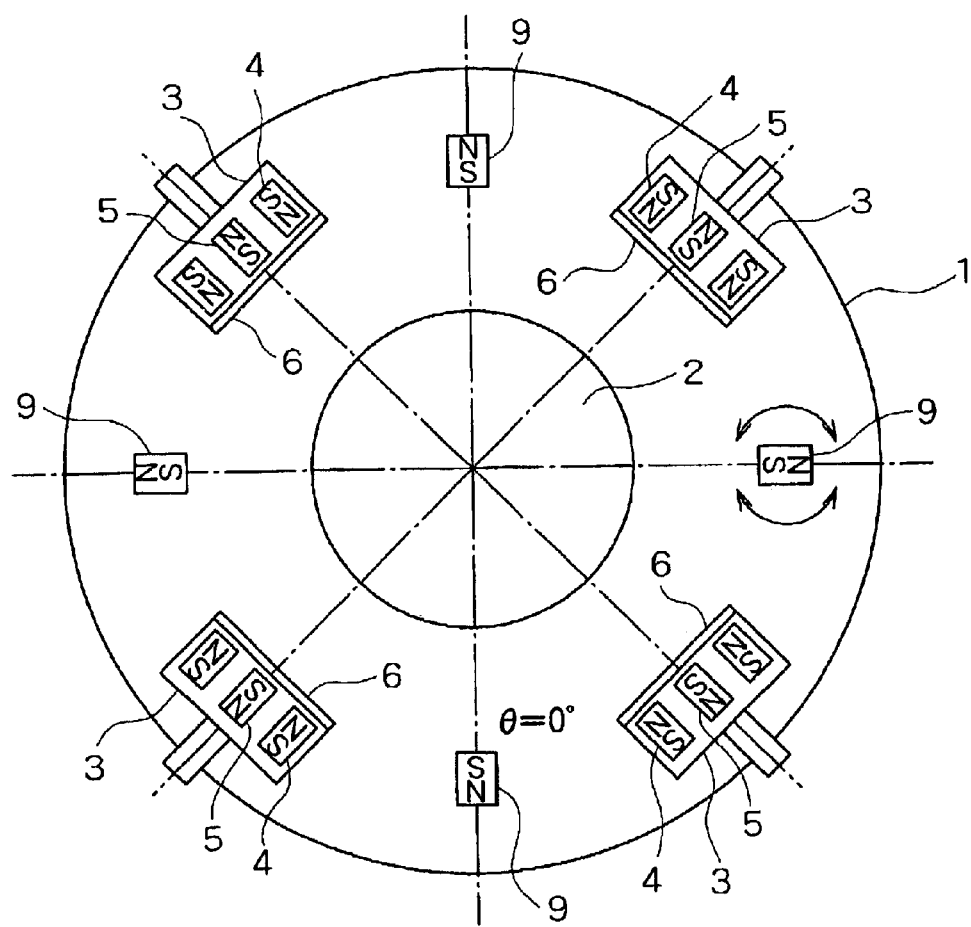
FIG. 1 is a plan view of the inside structure of a sputtering apparatus.

Referring now to the drawings, the embodiments of the invention will be described.

FIG. 1 shows a magnetron sputtering apparatus in a typical arrangement according to the invention, wherein four unbalance type magnetron sputtering evaporation sources are disposed.

In FIG. 1, a substrate (a solid substance to be deposited) 2 is disposed at the center of a vacuum chamber 1 and four magnetron evaporation sources 3 are disposed in the vacuum chamber 1 such that they surround the substrate 2. Each of the magnetron evaporation sources 3 has the same structure and comprises a ring-shaped outside magnet pole 4, an inside magnet pole 5 mounted in the center of the outside magnet pole 4 and a target 6 made of a source material. Moreover, each of the magnetron evaporation sources 3 is constituted in the form of an unbalance type magnetron evaporation source wherein the magnetic field strength in the outside magnet pole 4 forming the magnetron is greater than that in the inside magnet pole 5.

The magnetron evaporation sources 3 are arranged at regular spacing around the substrate 2 in the form of a ring and disposed in the same distance apart from the substrate 2. Each auxiliary magnet pole 9 is disposed at the middle position between each two adjacent evaporation sources 3. Each auxiliary magnet pole 9 is constituted mainly by a permanent magnet.

In the magnetron sputtering apparatus, an inert gas, such as argon, is fed into the vacuum chamber 1. When a minus voltage is applied to each magnetron evaporation source 3 relative to the grounded vacuum chamber 1 by means of a sputtering power supply (not shown), a glow discharge is generated between the vacuum chamber 1 and each magnetron evaporation source 3, and thereby plasma (electrons and argon ions) is produced inside the vacuum chamber 1. The argon ions in the vacuum chamber 1 collide with the target 6 in the evaporation source 3 made of the source material, so that metal atoms are evaporated from the magnetron evaporation source 3 (target 6) and then deposited onto the substrate 2, thus allowing a thin layer to be formed. The metal atoms are partially ionized in the vacuum chamber 1 and deposited at high energy onto the substrate 2, which is electrically biased at a negative potential.

Since the magnetron sputtering apparatus according to the invention is equipped with the auxiliary magnet poles, plasma generated from the evaporation source 3 is concentrated at a higher density around the substrate 2, so that the ionization of metal atoms evaporated from the evaporation source 3 is promoted. In conjunction with this fact, the ions collide with the layer formed on the substrate in a greater frequency, thereby enabling the adhesive force to the substrate 2 to be greatly enhanced and the layer structure to be effectively improved.

In FIG. 1, the polarity of each auxiliary magnet pole 9 relative to the substrate 2 is different from the polarity of the outside magnet pole 4 in the magnetron evaporation source 3. However, the auxiliary magnet pole 9 can be rotated by 360 degrees in the direction of the arrow indicted in FIG. 1, and can be further set at an arbitrary angle position.

Figure 2:
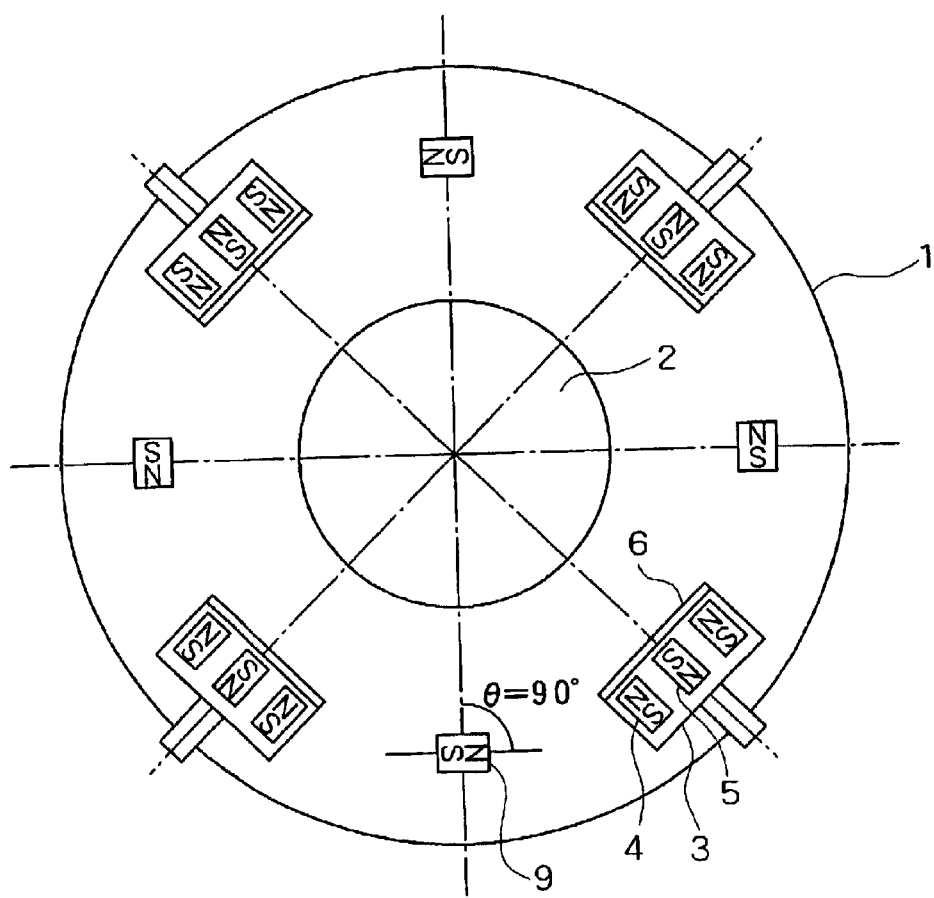
FIG. 2 is a plan view of the inside structure of the sputtering apparatus in the state of a changed alignment angle of auxiliary magnet poles.

FIG. 2 shows the arrangement in which the auxiliary magnet poles 9 are rotated by a rotary angle of $\theta=90$ degrees from the state in FIG. 1 (a rotary angle of $\theta=0$ degree; In the case of the polarity of the auxiliary magnet pole to the substrate direction is S), whereas FIG. 3 shows the arrangement in which the auxiliary magnet poles 9 are rotated by a rotary angle of $\theta=180$ degrees from the state in FIG. 1.

Figure 3:
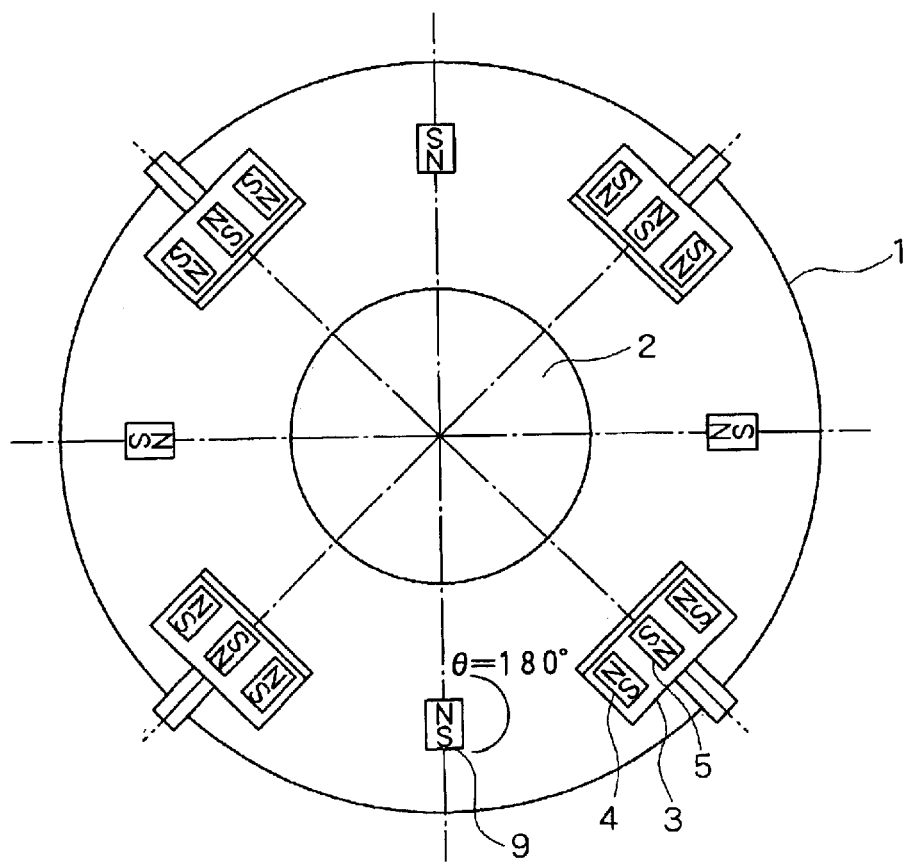
FIG. 3 is a plan view of the inside structure of the sputtering apparatus in the state of another changed alignment angle of the auxiliary magnet poles.

In FIG. 3, the polarity of the auxiliary magnet pole in the direction to the substrate is N and therefore is the same as the polarity of the outside magnet pole 4 in the magnetron evaporation source 3.

Figure 4:
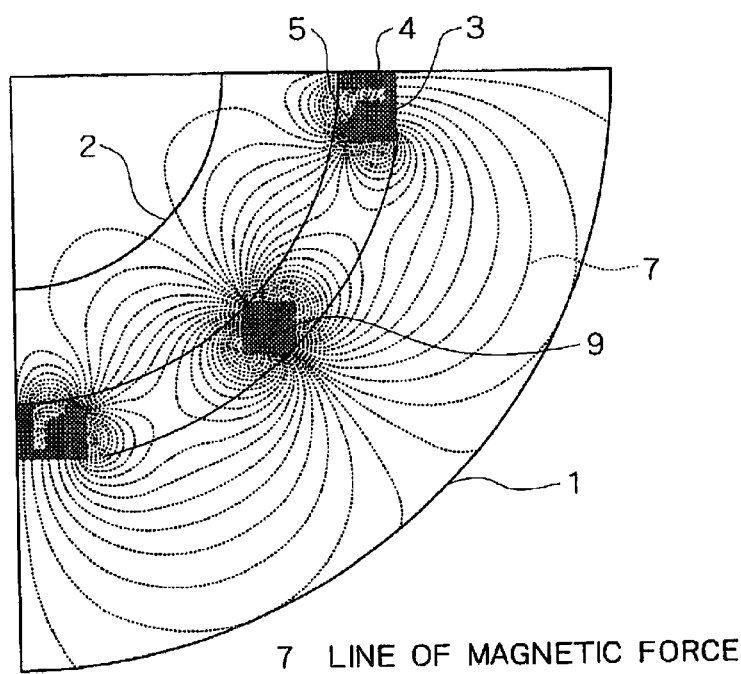
FIG. 4 is a distribution of a magnetic field calculated for the arrangement shown in FIG. 1.
Figure 5:
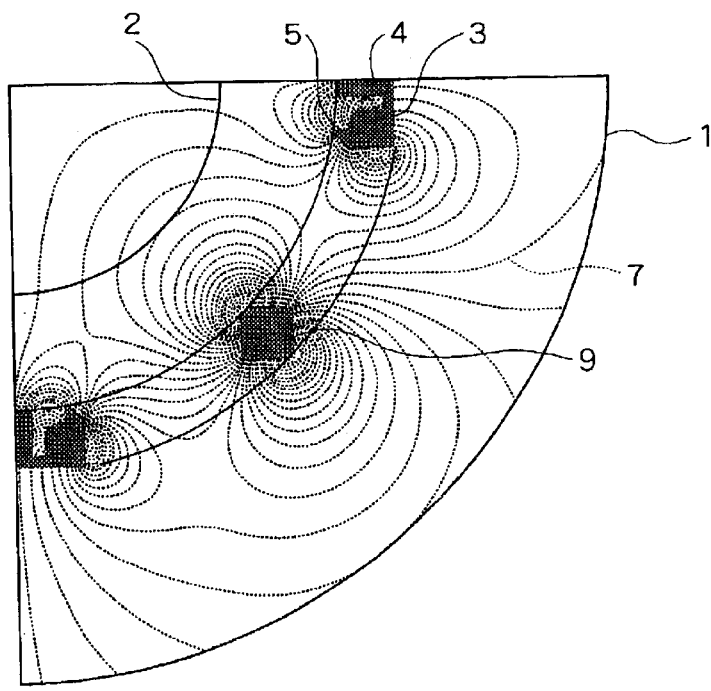
FIG. 5 is a distribution of a magnetic field calculated for the arrangement shown in FIG. 2.
Figure 6:
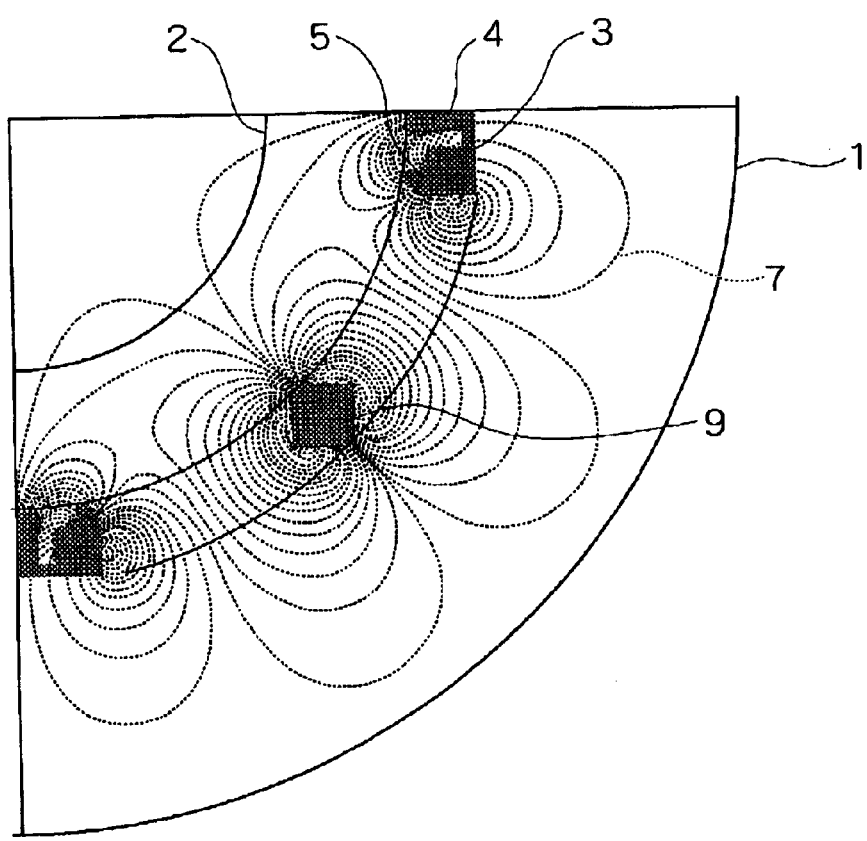
FIG. 6 is a distribution of a magnetic field calculated for the arrangement shown in FIG. 3.

FIG. 4 shows the numerically analyzed result for the field strength distribution of a magnetic field in the sputtering apparatus shown in FIG. 1 (the analyzed area being a quarter of the vacuum chamber). Similarly, FIGS. 5 and 6 show the numerically analyzed results for the field strength distribution of a magnetic field in the sputtering apparatus shown in FIG. 2 and 3, respectively. Furthermore, numeral 7 indicates a line of magnetic force in FIGS. 4 to 6.

As can be clearly seen in FIGS. 4 to 6, a rotation of the auxiliary magnet pole 9 provides a significant alteration in the shape of the magnetic field. Moreover, it can be recognized that the shape of the magnetic field can be finely altered, when the alignment angle of the auxiliary magnet pole 9 is slightly changed within the range where the polarity of the auxiliary magnet pole 9 in the direction to substrate 2 is changed from N to S.

Figure 7:
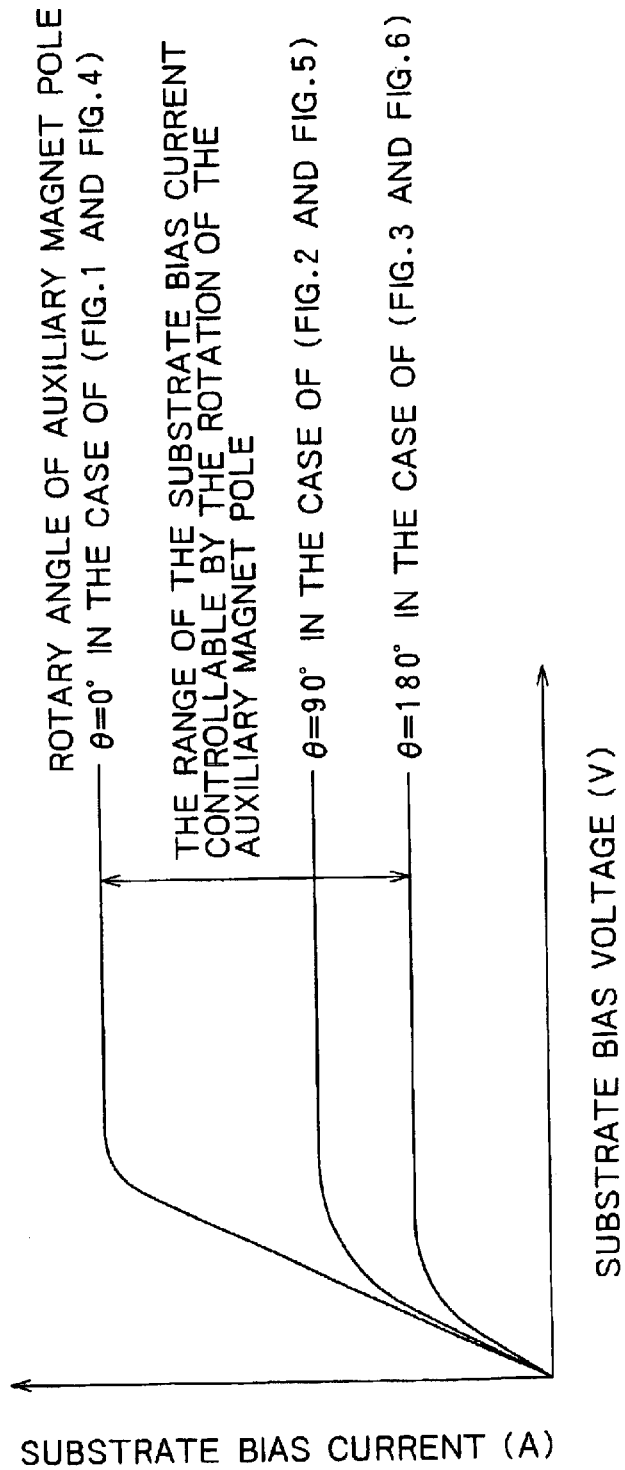
FIG. 7 is a diagram showing the relationship between the substrate bias voltage and the substrate bias current.

FIG. 7 shows the results of the bias current measured in the substrate 2 for the respective alignment angles of the auxiliary magnet poles 9, when the plasma is produced from argon gas. From the results shown in FIG. 7, it can be seen that an alteration of the rotary angle $\theta$ of the auxiliary magnet pole 9 allows the substrate bias current to be changed in a wide range.

When the polarity of the auxiliary magnet poles 9 in the direction to the substrate 2 is opposite to that of the outer magnet poles 4 in the magnetron evaporation source 3, as shown in FIG. 1, lines of magnetic force 11 are formed such that they sequentially connect each auxiliary magnet pole to the adjacent outside magnet pole in the corresponding magnetron evaporation source 3 in an alternating manner, so that a magnetic field is formed by the evaporators 3 and the auxiliary magnet poles 4 such that it surrounds the substrate 2, and thereby the plasma generated from the evaporators 3 can be confined within the circumference of the substrate 2.

As a result, high density plasma is generated around the substrate 2 from the magnetron evaporators 3, and the ionization of the metal atoms evaporated from the magnetron evaporators 3 is promoted, so that the argon ions and metal ions collide with a layer formed on the substrate 2 with a high frequency, thereby enabling the adhesive force between the layer and the substrate 2 to be enhanced and further the structure of the layer to be improved.

On the contrary, when the polarity of the auxiliary magnet poles 9 in the direction to the substrate 2 is the same as that of the outer magnet poles 4 in the magnetron evaporation source 3, as shown in FIG. 3, the magnetic fields generated from the outside magnetic poles 4 in the respective evaporation sources 3 and those generated from the respective auxiliary magnet poles 9 repel each other in the middle area between the outside magnet poles 4 and the auxiliary magnet poles 9. Accordingly, the magnetic fluxes are not concentrated in this area and thus the plasma generated by the glow discharge can be confined within the circumference of the substrate 2 by the mirror effect. In this case, the magnetic fields from the evaporator source 3 and that from the auxiliary magnet pole 9 repel each other, and therefore the magnetic fields in front of the evaporator sources 3 swell in the direction to the substrate 2 and lines of magnetic force connecting the auxiliary magnet poles 9 to the inside magnet poles 5 in the evaporation source 3 are also produced, so that the plasma expands in the direction to the substrate 2 and high density plasma is produced above the substrate 2. As a results, high density plasma is generated around the substrate 2 from the magnetron evaporators 3, and the ionization of the metal atoms evaporated from the magnetron evaporators 3 is promoted, so that the argon ions and metal ions collide with a layer formed on the substrate 2 with a high frequency, thereby enabling the adhesive force between the layer and the substrate 2 to be enhanced and further the structure of the layer to be improved.

Figure 8:
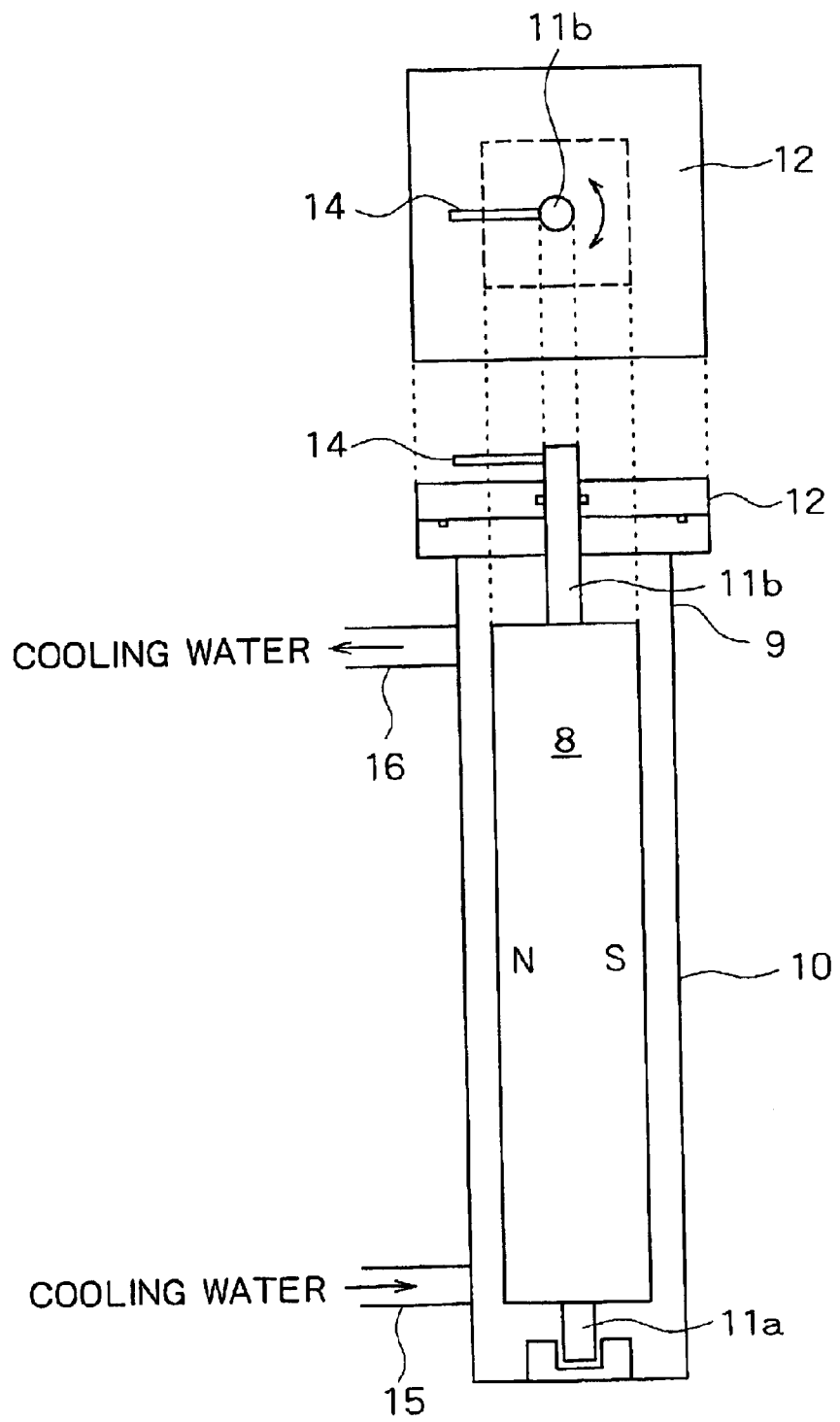
FIG. 8 is an embodiment of an angle changing mechanism for an auxiliary magnet pole.

FIG. 8 shows an angle changing mechanism for the auxiliary magnetic poles 9. The angle changing mechanism is constituted such that a permanent magnet 8 in each auxiliary magnet pole 9 can be rotated.

The auxiliary magnet pole 9 comprises the permanent magnet 8 in a magnet holder 10, and the angle changing mechanism is designed such that the rotary shafts 11a and 11b extending respectively from the upper and lower ends of the permanent magnet 8 are rotatably supported by the magnet holder 10 and the permanent magnet 8 can be rotated around the axis of the permanent magnet 8. In the state shown in FIG. 8, the S pole of the magnet 8 is positioned on the side of substrate 2 (on the right hand side in FIG. 8) and the N pole is positioned at the opposite side (corresponding to the state in FIG. 1). However, a rotation of the magnet 8 provides the state shown either in FIG. 2 or in FIG. 3.

The upper rotary shaft 11b extends from the flange 12 at the upper part of the holder 10 into the outside of the holder 10, and a handle 14 is disposed as a manual operation unit in the rotary shaft 11b outside the holder 10. A rotation of the handle 14 by manipulation outside the holder 10 provides a rotation of the rotary shafts 11a, 11b and permanent magnet 8, thereby enabling the shape of the magnetic field to be altered.

Moreover, the holder 10 has a feed opening 15 for feeding the cooling water from the outside of the chamber 1 and a discharge opening. 16 for discharging the cooling water to the outside thereof, and therefore serves as a cooling space for cooling the magnet 8 by circulating the cooling water inside the holder 10.

Figure 9:
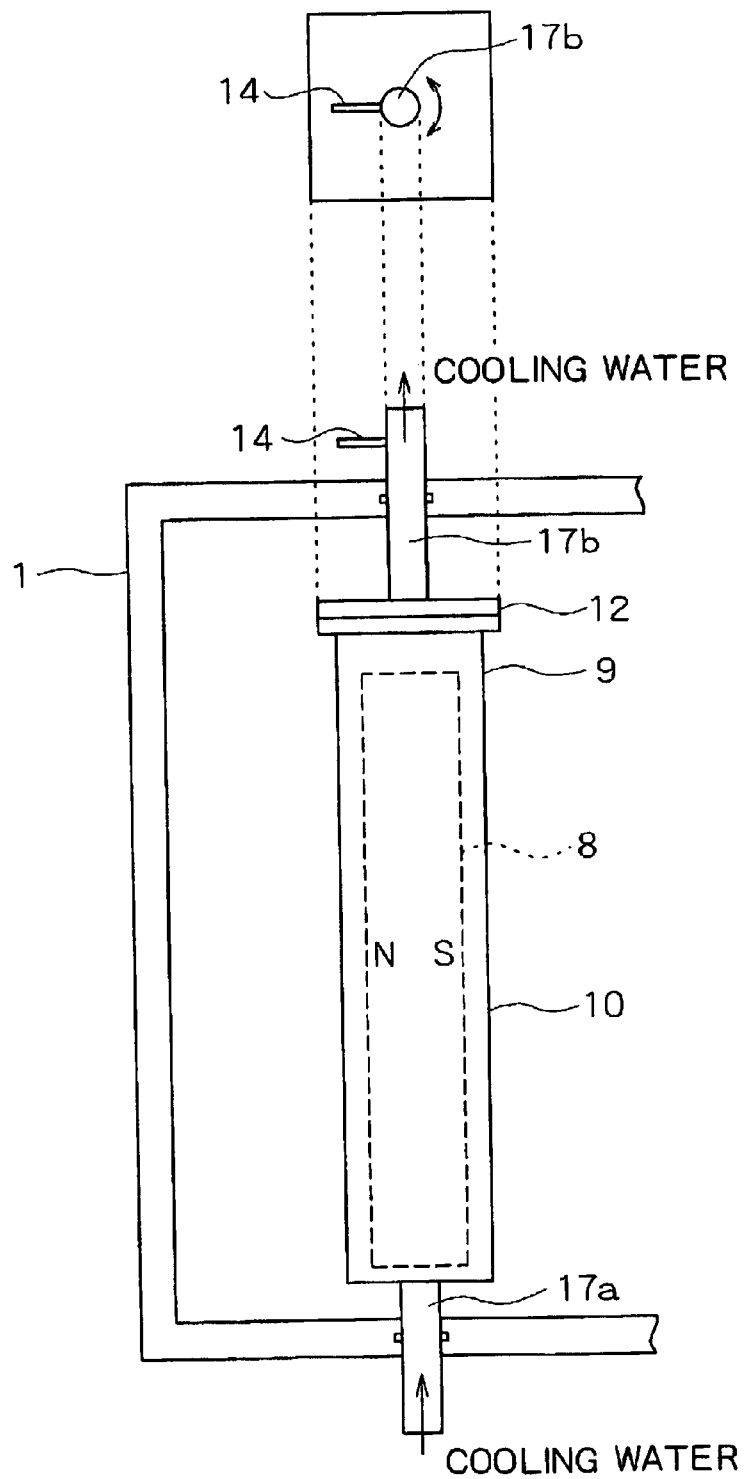
FIG. 9 is another embodiment of an angle changing mechanism for an auxiliary magnet pole.

FIG. 9 shows another embodiment of the angle changing mechanism. The angle changing mechanism is designed such that the whole structure of the auxiliary magnet pole 9 can be rotated.

The auxiliary magnet pole 9 is equipped with the permanent magnet 8 in the magnet holder 10. The angle changing mechanism is constituted such that the rotary shafts 17a and 17b extending respectively from the upper and lower ends of the holder 10 are rotatably supported on the chamber 1 and the holder 10 can be rotated around the longitudinal axis together with the magnet 8. In the state shown in FIG. 9, the magnet 8 has an S pole on the side of the substrate 2 (on the right hand side in FIG. 9) and an N pole on the opposite side (corresponding to the state in FIG. 1). However, a rotation of the magnet 8 provides such a state as shown either in FIG. 2 or in FIG. 3.

The upper rotary shaft 17b is disposed such that it passes through the wall outside of the chamber 1 in the form of a projection. A handle 14 is disposed as a manually manipulating element at the rotary shaft 17 outside the chamber 1. A rotation of the handle 14 by manipulation outside the chamber 1 provides a rotation of the rotary shafts 17a and 17b, and further provides a rotation of the permanent magnet 8 together with the holder 10, thereby allowing the shape of the magnetic field to be altered.

Furthermore, the upper and lower rotary shafts 17a and 17b are be used as pipes for supplying and discharging the cooling water into/from the holder 10, which serves as a cooling space.

Figure 10:
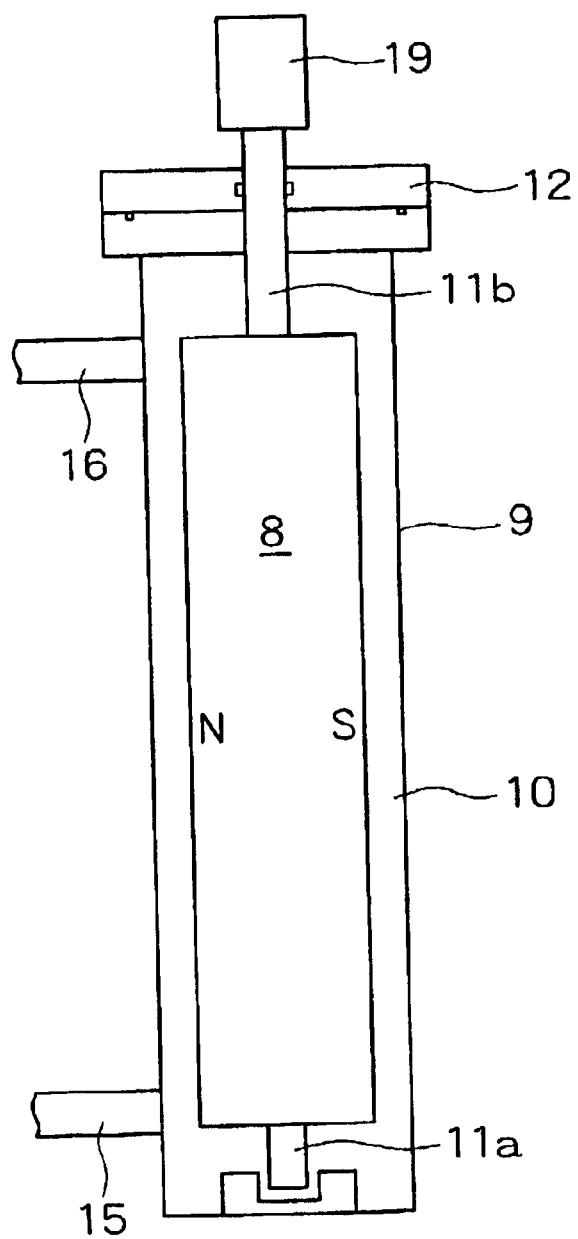
FIG. 10 is another embodiment of an angle changing mechanism for an another auxiliary magnet pole.

FIG. 10 shows a driving apparatus comprising a motor 19 for rotating the rotary shaft 11b in FIG. 8. In this case, the magnet 8 can be automatically rotated by means of the rotary force supplied from the motor 19. In such an apparatus including the handle 14 outside the chamber 1, as shown in FIG. 9, the magnet 8 can also be automatically rotated, if the handle 14 is replaced with a motor.

In order to alter the whole shape of magnetic field in the chamber 1, it is desirable that the auxiliary magnet poles 9 are simultaneously moved in synchronization with each other. A synchronized driving mechanism shown in FIG. 11 can be used to change the alignment angle of the auxiliary magnet poles in synchronization with each other. The synchronized driving mechanism is used to transmit a rotary power resulting from the handle 14 to the respective auxiliary magnet poles 9 arranged in the form of a ring for the apparatus including the handle 14, as shown in FIG. 8 or 9. The synchronized driving mechanism comprises rotary elements 20, such as pulleys or sprockets, mounted on the rotary shaft 11b of the respective auxiliary magnet poles 9 and a mechanical power transmission element 21, such as a belt or a chain.

In this case, a rotation of the handle 14 causes the rotary elements 20 to be rotated either directly or via the mechanical power transmission element 21. As a result, the alignment angles of the respective auxiliary magnet poles 9 can be changed in synchronization with each other, thereby enabling the whole shape of the magnetic field in the chamber 1.

Figure 11:
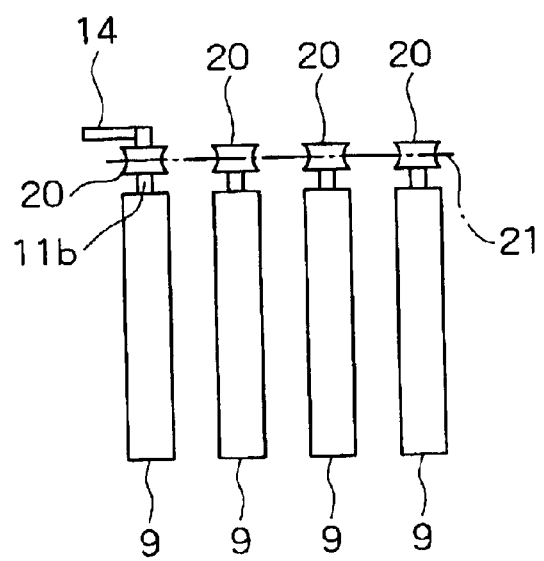
FIG. 11 is a schematic view of a mechanism for simultaneously rotating a plurality of auxiliary magnet poles.

Alternatively, a driving apparatus, such a motor or the like, as shown in FIG. 10, can be used in lieu of the handle shown in FIG. 11.

Figure 12:
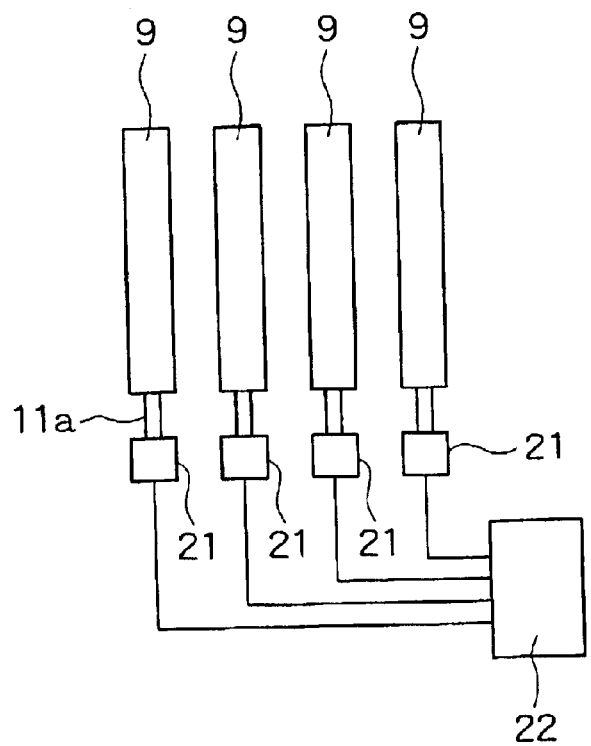
FIG. 12 is a schematic view of a mechanism for simultaneously rotating a plurality of auxiliary magnet poles with the aid of a controlling unit.

In the case of using the driving apparatus, only one motor is used for the synchronized driving mechanism in FIG. 11. However, it can be envisaged that a driving apparatus 21 is mounted on each auxiliary magnet pole 9, as shown in FIG. 12, and the respective driving apparatuses 21 are controlled to be rotated in synchronization with each other by a control unit 22.

It is to be understood that the present invention is not restricted to the above-described embodiments.

Industrial Applicability

As described above, the present invention is effective for a sputtering apparatus for forming a thin layer by utilizing the magnetron sputtering method.

FIG. 4:
Line of Magnetic Force
FIG. 7:
Substrate Bias Voltage (V)
Substrate Bias Current (A)
Rotary Angle of Auxiliary Magnet Pole
θ=0° in the case of (FIG. 1 and FIG. 4)
The Range of the Substrate Bias Current Controllable by the Rotation of the Auxiliary Magnet Pole
θ=90° in the case of (FIG. 2 and FIG. 5)
θ=180° in the case of (FIG. 3 and FIG. 6)
FIG. 8:
Cooling Water
FIG. 9:
Cooling Water

What is claimed is:

1. A sputtering apparatus wherein one or more magnetron sputtering evaporation sources and one or more auxiliary magnet poles are disposed in a chamber so as to surround a substrate is to have material deposited thereon, wherein an angle changing is disposed mechanism is disposed changing the alignment angle of said one or more auxiliary magnet poles relative to said substrate in order to alter the shape of the magnetic field formed by said magnetron sputtering evaporation sources and said one or more auxiliary magnet poles.

2. The sputtering apparatus according to claim 1, wherein said angle changing mechanism is designed such that said one or more auxiliary magnet poles can be aligned in an arbitrary angle.

3. The sputtering apparatus according to claim 1, wherein a mechanical power supply unit for supplying a mechanical power to said angle changing mechanism to change the alignment angle is disposed outside said chamber.

4. The sputtering apparatus according to claim 3, wherein said mechanical power supply unit is a manual manipulation unit disposed outside said chamber to manually drive said angle changing mechanism outside the chamber.

5. The sputtering apparatus according to claim 3, wherein said mechanical power supply unit is a driving apparatus for supplying a mechanical power to said angle changing mechanism outside the chamber to automatically change the alignment angle of the one or more auxiliary magnet poles.

6. The sputtering apparatus according to claim 1, wherein a plurality of said one or more auxiliary magnet poles is disposed and designed such that the alignment angles thereof can be changed in synchronization.

* * * * *

UNITED STATES PATENT AND TRADEMARK OFFICE
CERTIFICATE OF CORRECTION

PATENT NO. : 6,749,730 B2
DATED : June 15, 2004
INVENTOR(S) : Kohara et al.

It is certified that error appears in the above-identified patent and that said Letters Patent is hereby corrected as shown below:

<u>Title page,</u>
Item [73], Assignee, should read:

-- [73] Assignee: Kabushiki Kaisha Kobe Seiko Sho (Kobe Steel, Ltd.), Kobe (JP) --

Signed and Sealed this

Twenty-third Day of November, 2004

JON W. DUDAS
*Director of the United States Patent and Trademark Office*